(12) United States Patent
Koizumi et al.

(10) Patent No.: US 6,983,002 B2
(45) Date of Patent: Jan. 3, 2006

(54) SEMICONDUCTOR LASER DEVICE AND OPTICAL PICKUP USING THE SAME

(75) Inventors: Hideshi Koizumi, Yamatotakada (JP); Ayumi Yagi, Yamatotakada (JP); Kazunori Matsubara, Shiki-gun (JP); Nobumasa Kaneko, Kitakatsuragi-gun (JP)

(73) Assignee: Sharp Kabushiki Kaisha, Osaka ( * ) Notice: Subject to any disclaimer, the term of this patent is extended or adjusted under 35 U.S.C. 154(b) by 255 days.

(21) Appl. No.: 10/677,030

(22) Filed: Sep. 30, 2003

(65) Prior Publication Data

US 2004/0066813 A1    Apr. 8, 2004

(30) Foreign Application Priority Data

Sep. 30, 2002  (JP)  ............................ 2002-286806
Sep. 12, 2003  (JP)  ............................ 2003-321541

(51) Int. Cl.
    *H01S 3/04*     (2006.01)
(52) U.S. Cl. .............................. 372/36; 372/34; 372/43
(58) Field of Classification Search ................. 372/36, 372/34

See application file for complete search history.

(56) References Cited

U.S. PATENT DOCUMENTS 6,496,524 B2 * 12/2002 Miyokawa et al. ........... 372/36

FOREIGN PATENT DOCUMENTS

| JP | 06-005990 | | 1/1994 |
|----|-----------|---|--------|
| JP | 06-203403 | | 7/1994 |
| JP | 2000-196176 | | 7/2000 |
| JP | 2000-196177 | * | 7/2000 |
| JP | 2001-111159 | | 4/2001 |

* cited by examiner

*Primary Examiner*—Minsun Oh Harvey
*Assistant Examiner*—Dung (Michael) T. Nguyen
(74) *Attorney, Agent, or Firm*—Morrison & Foerster LLP

(57) ABSTRACT

A semiconductor laser device, with which a compact and thin optical pickup can be realized, is provided. On the top surface of a supporting member, there is formed an element mounting area for mounting a series of elements including a semiconductor laser element, and a light detecting element which detects a laser beam emitted from the semiconductor laser element and reflected by a surface of an outside optical disc so as to be re-entered. An optical path from the semiconductor laser element to the surface of the optical disc includes a vertical optical path advancing from the element mounting area of the supporting member in an approximately vertical upward direction. On a pair of right and left opposing ends of the supporting member, arcuate curved outer surfaces are formed, respectively, so as to fit the supporting member into an installation hole, for a semiconductor laser device, having arcuate curved inner surfaces. These curved outer surfaces are formed of arcs having the vertical optical path as the central axes, and are so formed that the curvature radiuses of the right and left arcs are different.

10 Claims, 8 Drawing Sheets

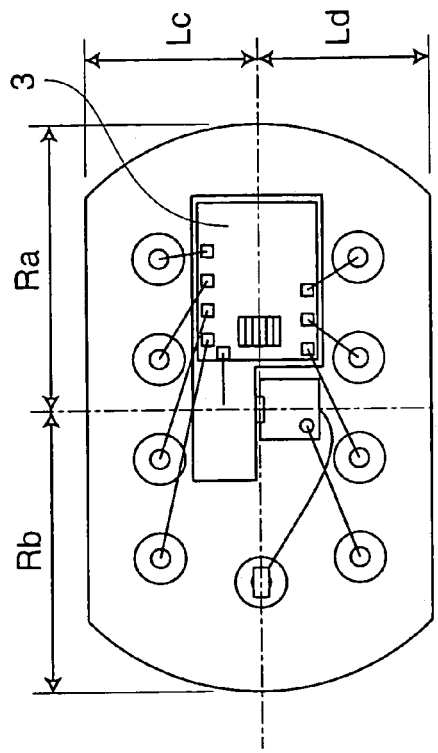
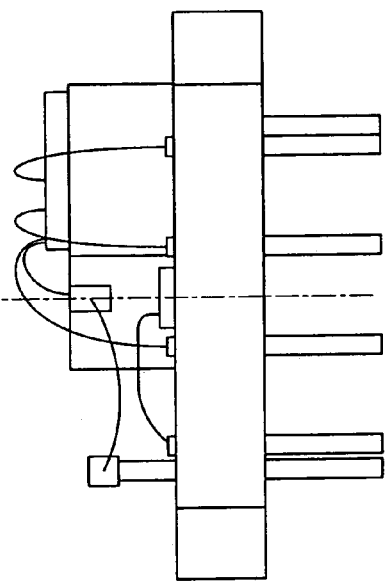
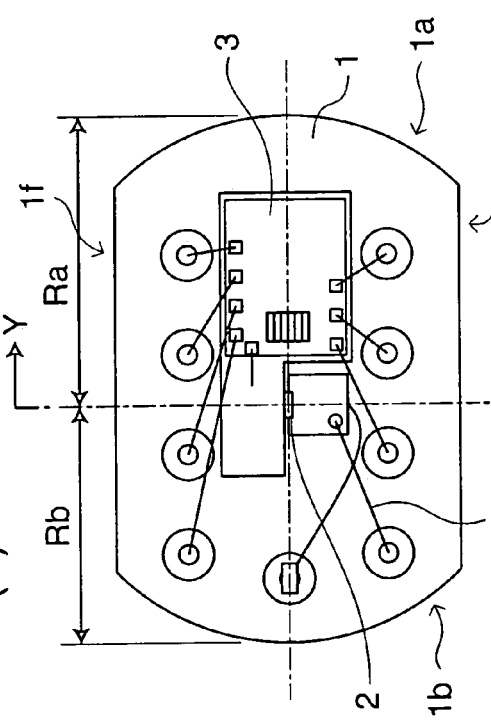
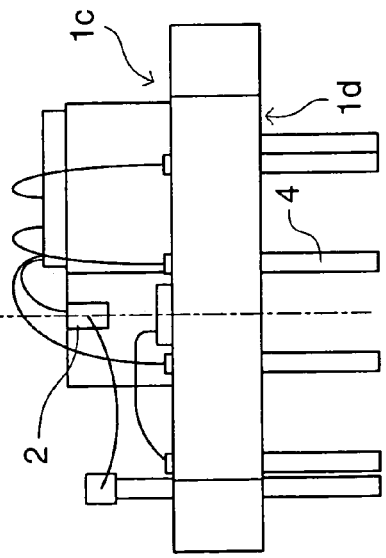

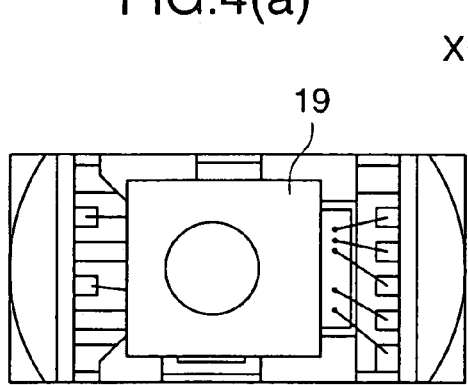
FIG.4(a)
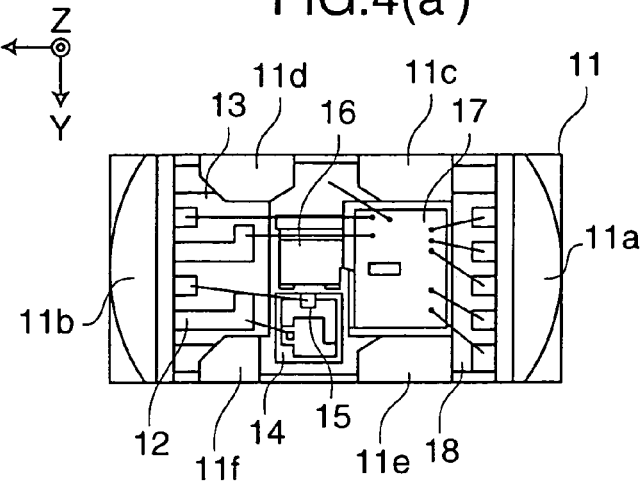
FIG.4(a')
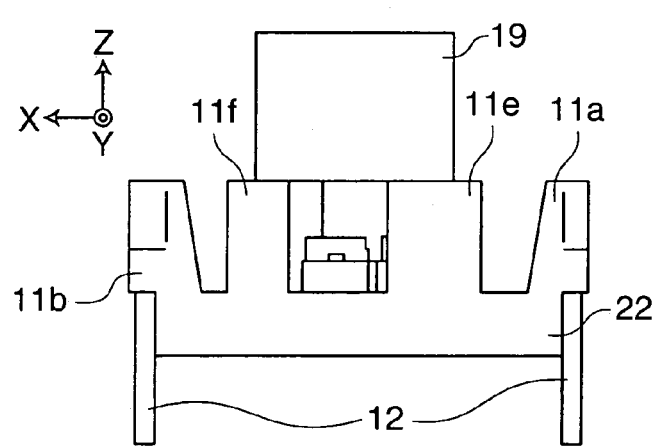
FIG.4(b)
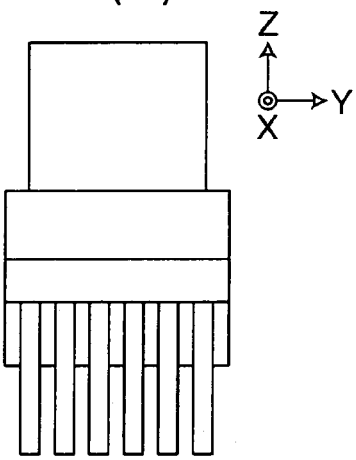
FIG.4(b')
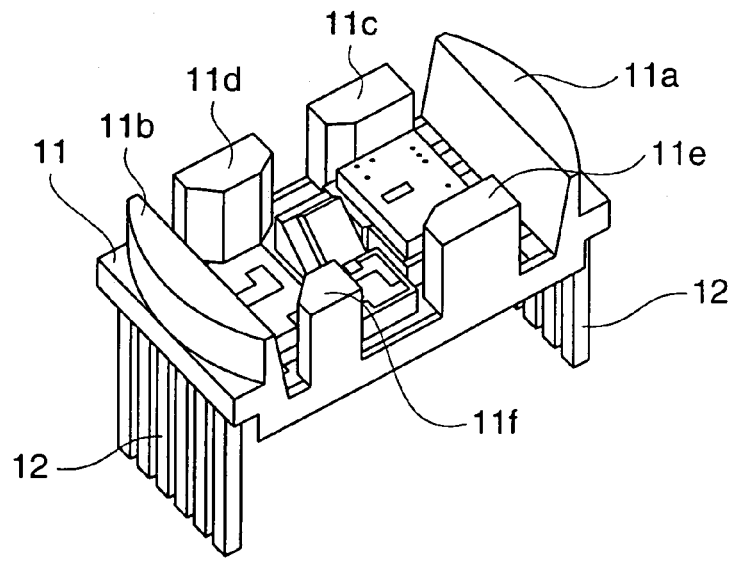
FIG.4(c)

Rb < Ra

Rb = Ra (REFERENCE)

(REFERENCE)

(REFERENCE)

SEMICONDUCTOR LASER DEVICE AND OPTICAL PICKUP USING THE SAME

CROSS-REFERENCE TO RELATED APPLICATION

This application is related to Japanese application No. 2002-286806 filed on Sep. 30, 2002 and No. 2003-321541 filed on Sep. 12, 2003, whose priorities are claimed under 35 USC § 119, the disclosures of which are incorporated by reference in its entirety.

BACKGROUND OF THE INVENTION

1. Field of the Invention

The present invention relates to, a semiconductor laser device for use in an optical pickup and the like which optically reads information recorded in an optical recording medium such as an optical disc, and to an optical pickup using the semiconductor laser device.

2. Description of the Related Art

In the optical pickup which reads signals in optical discs such as CD-ROM and MD(Mini Disc), a semiconductor laser device is employed. The semiconductor laser device may be of (1) a type, mainly the CAN type, in which single pieces of semiconductor laser element, optical component and signal detecting element are discretely fabricated, or (2) a type called the hologram laser type in which a diffraction grating, a signal detecting element and a semiconductor laser element are integrally formed.

Among these types, a semiconductor laser device of the hologram laser type, described in (2) above, is so configured that a semiconductor laser element, a hologram element as a light branching element and a light detecting element are incorporated into a package (supporting member). In this configuration, a laser beam emitted from the semiconductor laser element is guided onto a surface of the optical disc which is the optical recording medium so as to be reflected, and the reflected laser beam returned from the surface of the optical disc is diffracted by the hologram element to thereby be guided to the light detecting element.

As a semiconductor laser device of this type, one disclosed in the Japanese Unexamined Patent Publication No. Hei6(1994)-5990 is known.

FIG. 7 is a schematic diagram showing the structure of another conventional semiconductor laser device of the hologram laser type than the one shown in the Japanese Unexamined Patent Publication No. Hei 6(1994)-5990 (In FIG. 7, the device is illustrated with a part fractured so as to show the inner structure). The device of this example uses a metal stem as a supporting member.

In FIG. 7, the reference numeral 71 indicates a stem as a supporting-member, 72 indicates a semiconductor laser element, 73 indicates a light detecting element for detecting signals, and 74 indicates a cap. The reference numeral 77 indicates a hologram element as a light branching element having diffraction grating patterns shown by the numerals 75 and 76.

On the top surface of the stem 71, plane areas, horizontal and vertical, are provided, on which the light detecting element 73 and the semiconductor laser element 72 are mounted. Both the left-end surface 71a and the right-end surface 71b of the stem 71 are formed as arcuate curved surfaces.

When the semiconductor laser device is incorporated into a part of the optical pickup, the left-end surface 71a and the right-end surface 71b each having the arcuate curved surface are pressed so as to be fitted into a portion being the reference (reference portion) such as a cylindrical window having an arcuate curved inner surface provided in the pickup housing, in such a manner that the both arcuate portions coincide with each other, to thereby position a vertical optical path (an optical path of a laser beam advancing in an approximately vertical upwards direction with reference to the top surface on which the elements are mounted).

Then, in the state that the semiconductor laser device is installed in the reference portion (arcuate curved inner surface), the semiconductor laser device is turned within the angular range of ±5° around the vertical optical path. With this process, three beam spots emitted from the semiconductor laser device are adjusted so as to be in the optimum arrangement on the pit row of the disc surface. This adjustment is called a turning adjustment.

It should be noted that in FIG. 7, wires for electrically connecting electrodes (terminals) of respective elements mounted on the stem 71 and leads 78 for outer connection (provided so as to be insulated from the stem 71) are not shown.

SUMMARY OF THE INVENTION

It is an object of the present invention to provide a thin and compact semiconductor laser device which is capable of suppressing the manufacturing costs and is easily adjusted at the time of fabrication, and to provide an optical pickup using the semiconductor laser device.

According to one aspect of the present invention, there is provided a semiconductor laser device including an element mounting area, which is formed on the top surface of a supporting member having a plane area surrounded by a pair of right and left opposing ends and a pair of front and back opposing sides, for mounting a series of elements including: a semiconductor laser element, and a light detecting element which detects a laser beam emitted from the semiconductor laser element and reflected at an outside optical disc surface so as to be re-entered. In the device, an optical path of the laser beam from the semiconductor laser element to the optical disc surface includes a vertical optical path advancing from the element mounting area in an approximately vertical upwards direction with reference to the element mounting area of the supporting member, and arcuate curved outer surfaces are formed on the pair of right and left opposing ends of the supporting member, respectively, or on a pair of right and left protrusions formed on the supporting member, respectively, by which the supporting member is fitted into an installation hole, for a semiconductor laser device, having arcuate curved inner surfaces. The arcuate curved outer surfaces are formed of arcs, the central axes of which are the vertical optical path, and are so formed that the lengths of curvature radiuses of right and left sides are different.

BRIEF DESCRIPTION OF THE DRAWINGS

FIG. 1(a) is a schematic diagram showing a top view and a front view of a semiconductor laser device according to an embodiment of the present invention.

FIG. 1(b) is a top view and a front view of a conventional aquivalent device.

FIGS. 4(a) to 4(c), and FIGS. 4(a') and 4(b') are diagrams showing the structure of a semiconductor laser device according to another enbodiment of the present invention.

PREFERRED EMBODIMENTS OF THE PRESENT INVENTION

Figure 8A:
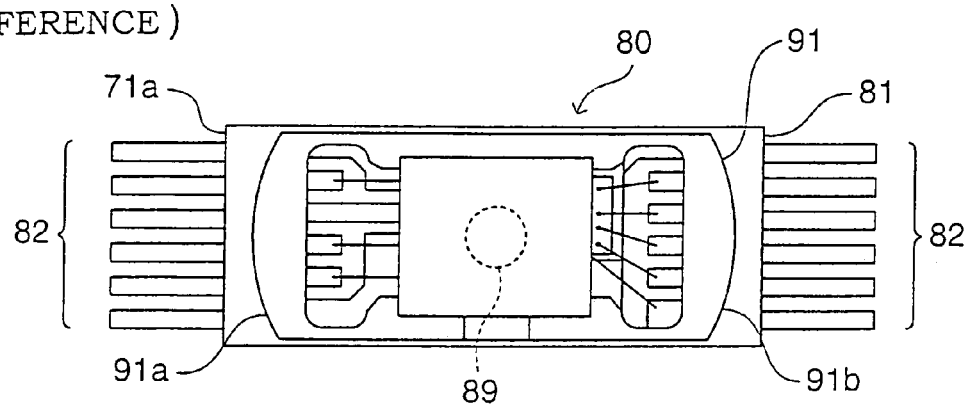
FIGS. 8(a) to 8(c) are references for the present invention and are diagrams showing the structure of a semiconductor laser device.
Figure 8B:
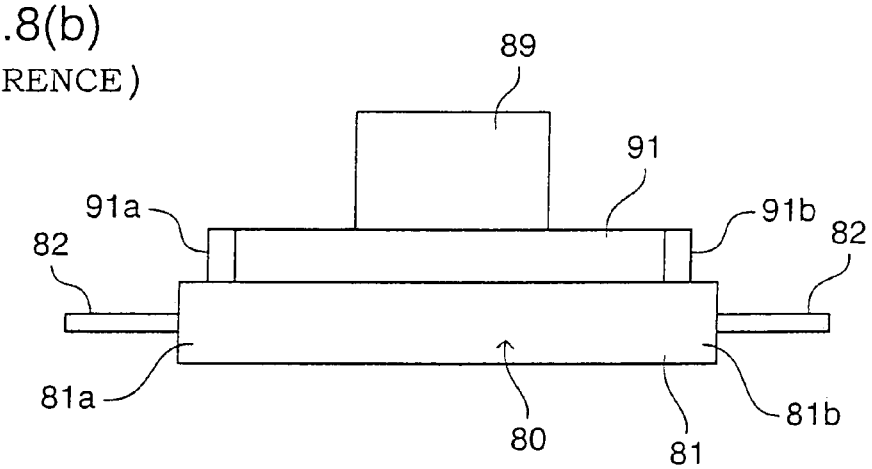
Figure 8C:
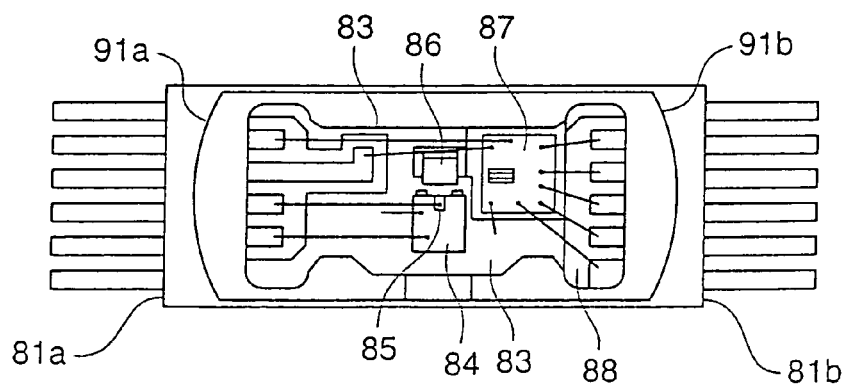

FIGS. 8(a), 8(b) and 8(c) are references for the present invention and are diagrams showing the structure of a semiconductor laser device of a lead frame type, disclosed in the co-pending Japanese Patent Application No. 2002-66601, which is an invention developed by the applicant of the present invention. FIG. 8(a) is a top view of the semiconductor laser device, FIG. 8(b) is a front view thereof, and FIG. 8(c) is a top view where the hologram element is removed from the device shown in FIG. 8(a).

In FIGS. 8(a), 8(b) and 8(c), the reference numeral 80 indicates an electrically insulative frame body acting as a package (supporting member). The insulative frame body 80 comprises a rectangle base 81 which is longer in a right and left direction (lateral direction), and a frame 91 formed so as to project upward along the periphery of the base 81.

On the top surface of the base 81, a plane having an angle of 45° with reference to the horizontal plane is formed, on which a light detecting element 87, a semiconductor laser element 85, a reflecting mirror 86, and the like are mounted. The frame 91 is formed as approximate rectangle having the common lateral direction with the base 81, but a little smaller than the base 81. On the outer surfaces of both the left and right ends of the frame 91, arcuate curved portions 91a and 91b are formed, respectively.

To both the left and right portions 81a and 81b of the base 81 of the insulative frame body 80, a plurality of leads 82 are provided, respectively, so as to penetrate the frame 91 from the inside to the outside. Further, on the insulative frame body 80, a hologram element 89 is mounted so as to be supported around the center of the frame 91 of the insulative frame body 80.

On an island plate 83 inside the frame 91, a semiconductor laser element 85 is mounted via a submount 84. Closely adjacent to the semiconductor laser element 85, there is mounted a reflector 86 (for example, a reflecting mirror) for reflecting a beam emitted from the semiconductor laser element 85 to 90° upward. Further, a light detecting element 87 is mounted adjacent to these elements. As for elements, among these elements, which need to connect electrically to the outside, electrodes of respective elements electrically connect to the leads 82 through wires 88.

When the semiconductor laser device is incorporated into a part of the optical pickup, the left-end surface 91a and the right-end surface 91b each having the arcuate curved surface formed in the frame 91, which is a part of the package (supporting member) are pressed so as to be fitted into a reference portion such as a cylindrical window having an arcuate curved inner surface provided in the pickup housing, in such a manner that the both arcuate portions coincide with each other, to thereby position a vertical optical path.

Figure 7:
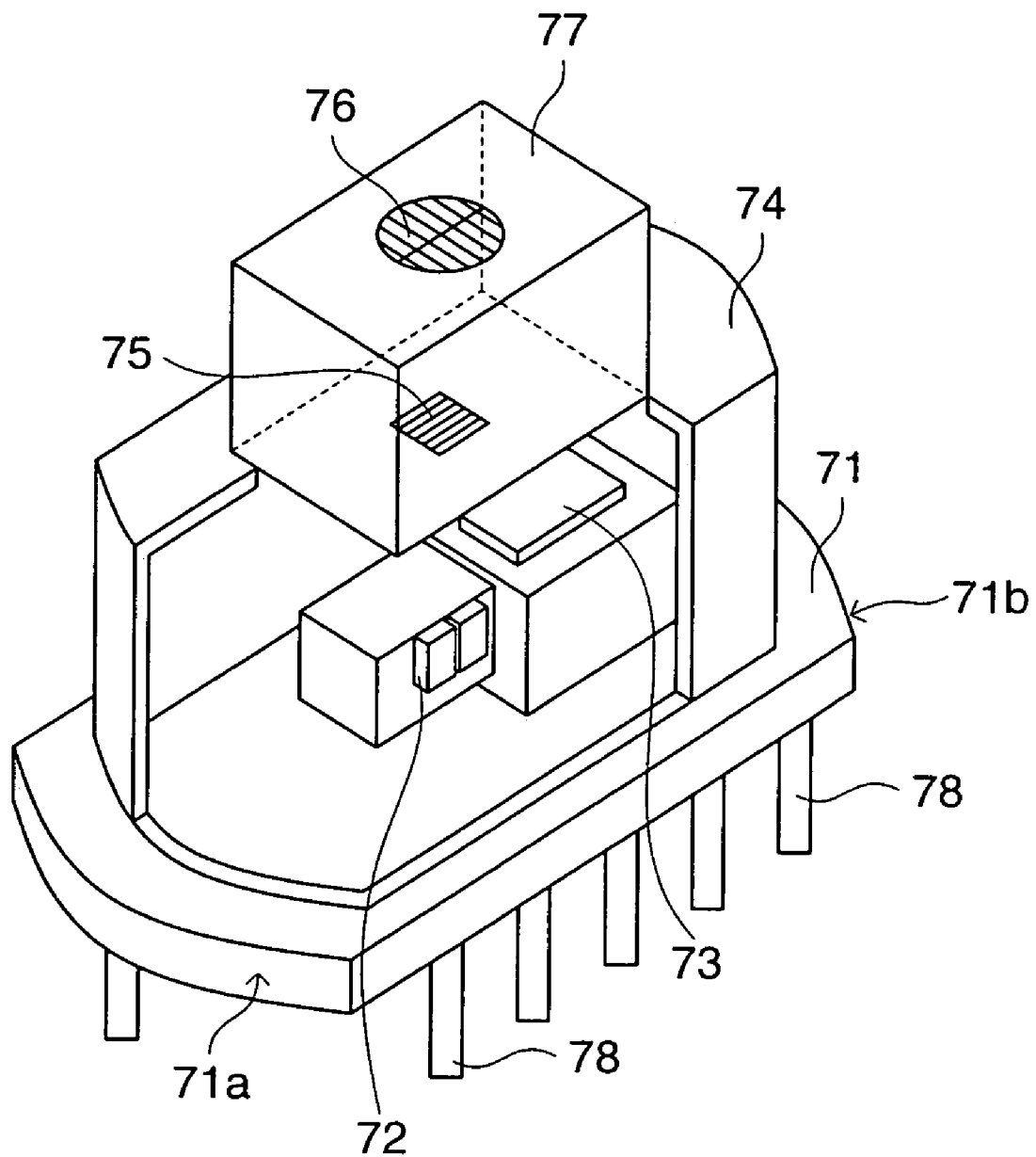
FIG. 7 is a schematic diagram showing the structure of a conventional semiconductor laser device.

A semiconductor laser device needs to perform the aforementioned turning adjustment when incorporated into the optical pickup, and is required that the center position of the vertical optical path never deviates when performing the turning adjustment. Therefore, a conventional semiconductor laser device has been so designed that a pair of arcuate both-end surfaces 71a and 71b (in FIG. 7) or a pair of arcuate both-end surfaces 91a and 91b (in FIGS. 8(a) to 8(c)) are formed so as to be in point symmetry each other, and the center of the arc is positioned at the center of the outer shape of the package (supporting member), that is, the center of the stem 71 in the case of the type shown in FIG. 7, and the center of the frame 91 in the case of the type shown in FIGS. 8(a) to 8(c).

In recent years, there are severe demands for thin, compact and low priced optical disc driving apparatuses, and the similar demands are also increasing for the semiconductor laser devices of the hologram type as described above.

Despite these demands, in the configuration in which the vertical optical path of the laser beam is positioned at the center of the outline of the package of the semiconductor laser device, the occupancy rate of an area where no components are mounted is high, caused by the package being bilateral symmetry with reference to the vertical optical path, so that the area of the package is enlarged.

FIG. 8(c) clearly shows this state. In the FIG. 8(c), the device is so configured that the mirror surface of the reflecting mirror 86 comes around the center of the package 80, more specifically, positions at the center of the arc of the arcuate frame portions 91a and 91b formed bilateral symmetrically, and that the mirror surface positions at an angle of 45° against the top surface of the base 81. Further, the device is so configured that the vertical optical path when the laser beam emitted from the semiconductor laser element 85 is reflected at the reflecting mirror 86 vertically upwards, positions at the center of the arc. In the layout of this figure, the light detecting element 87 is arranged on the right side of the reflecting mirror 86. In contrast, no element is arranged on the left side of the reflecting mirror 86, so that the space remains.

As the package (supporting member) area is enlarged, required metal materials and resin materials are also increased, and so the cost as well. Especially, since the hologram element is expensive, it is preferable that the element becomes as small as possible in order to suppress the cost. If the package is enlarged, the peripheral portion, which is not in need essentially, is required beyond the necessity, causing the cost to be risen. Therefore, it is required that the device include the package area formed as small as possible, on which the necessary elements should be arranged, while the necessary space for wiring should be secured.

The present invention aims to improve the above mentioned semiconductor laser device and give a merit.

According to the present semiconductor laser device, an optical path of a part of the laser beam emitted from the semiconductor laser device mounted on the element mounting area formed on the top surface of the supporting member is to be the vertical optical path advancing in an approximately vertical upwards direction with reference to the element mounting area. Arcuate curved outer surfaces are formed on the pair of right and left opposing ends of the supporting member, respectively, or on a pair of right and left protrusions formed on the supporting member, respectively, by which the supporting member is fitted into an installation hole, for a semiconductor laser device, having arcuate curved inner surfaces. These arcuate curved outer surfaces are formed of arcs, the central axes of which are the vertical optical path, and are so formed that the lengths of curvature radiuses of right and left sides are different. Therefore, when elements which should be mounted are arranged onto one side, among the element mounting area, where the curvature radius of the arc is longer, and no elements are arranged onto another side where the curvature radius is shorter, it is possible to make the element mounting area smaller comparing to the conventional devices, so that a more compact semiconductor laser device can be obtained.

The supporting member may comprise an electrically insulative casing including: a base having the plane area surrounded by the opposing ends and the opposing sides, a pair of first protrusions formed on the base along the pair of right and left opposing ends so as to put the plane area in between them, and a plurality of second protrusions formed on the base along the pair of front and back opposing sides so as to put the plane area in between them. With this configuration, the pair of first protrusions can be used for positioning when the semiconductor laser device is incorporated into the optical pickup, and the plurality of second protrusions can be used for supporting a light branching element (hologram element).

It is preferable that the light detecting element be mounted to be biased to either of right or left side of the curved outer surfaces, and that a curvature radius of the arc, corresponding to the side of the curved outer surface to which the light detecting element is mounted to be biased, be longer than a curvature radius of the arc corresponding to the opposing curved outer surface. With this configuration, it is possible to make the outer size of the supporting member smaller while keeping the space for mounting the light detecting element. Further, it is also possible to reduce the unit cost of materials.

It is also preferable that the supporting member be so configured as to have the vertical optical path on a position which is biased to either front or back side of the opposing sides. With this configuration, the supporting member can be compact not only in the right and left direction but also in the front and back direction.

The present semiconductor laser device may be configured that the element mounting area further mounts a reflector, and a laser beam is emitted from the semiconductor laser element in parallel to the top surface of the supporting member and reflected by the reflector so as to form the vertical optical path. With this configuration, the semiconductor laser element is able to emit a laser beam to a horizontal direction, and the degree of freedom of the installation of the semiconductor laser element can be secured further.

According to another aspect of the present invention, there is provided the optical pickup comprising a pickup housing. In the pickup housing, an installation hole having arcuate curved inner surfaces is, to which hole the supporting member is fitted into in such a manner that the arcuate curved outer surfaces of the semiconductor laser device according to one aspect of the present invention coincide with the installation hole. According to this pickup, the optical pickup into which a compact semiconductor laser device is incorporated can be achieved, so that the optical pickup itself can be compact.

According to the present invention, it is possible to miniaturize the outer size of the package (supporting member) of a semiconductor laser device, and to manufacture a compact and thin optical pickup, a CD drive, and a CD player. Further, it is also possible to easily perform an adjustment of the optical axis in manufacturing the optical pickup, and a turning adjustment of three beams.

(Embodiment 1)

FIG. 1(*a*) is a schematic diagram showing a top view and a front view of a semiconductor laser device using a stem as a supporting member according to an embodiment of the present invention. For comparison, a top view and a front view of a conventional equivalent device is shown in FIG. 1(*b*). In FIG. 1(*a*), although the device is shown without a cap and a hologram element for convenience, the state in which these components are provided is same as that shown in FIG. 7.

In FIG. 1(*a*), the reference numeral 1 indicates a stem as a supporting member, 2 indicates a semiconductor laser element, 3 indicates a light detecting element for detecting signals, 4 indicates leads for outer connection, and 5 indicates wires connecting the elements 2 and 3 with the lead 4. The stem 1 acts as a tabular supporting member having a plane area surrounded by a pair of right and left opposing ends and a pair of front and back opposing sides. The outer appearance of the stem 1 is so formed that the curved outer surface 1*a* at the right end and the curved outer surface 1*b* at the left end are arcuate, the top surface (upper side) 1*c* and the bottom surface (reverse side) 1*d* are planes in parallel each other, and the front surface (front side) 1*e* and the back surface (rear side) 1*f* are planes in parallel each other.

The semiconductor laser element 2 is so arranged that the laser beam is emitted in a vertical upwards direction with reference to the top surface 1*c*. Here, a part of the optical path of the laser beam advancing vertically upwards with reference to the top surface 1*c* is called a vertical optical path.

The semiconductor laser element 2 and the light detecting element 3 are disposed on a metal block acting as a heat sink.

The relationship of the curved outer surface 1*a* at the right end and the curved outer surface 1*b* at the left end is, assuming that each curvature radius of the arcuate curved surfaces is Ra and Rb, respectively, set to be Ra>Rb. Further, each central axis of the curved outer surface 1*a* at the right end and the curved outer surface 1*b* at the left end is set so as to coincide with the vertical optical path.

In this configuration, by setting the center at Y–Y' cross section, across the top surface 1*c* through the vertical optical path (in this embodiment, coinciding with the position of the laser beam emitting port) and vertical to the front surface 1*e* and the back surface 1*f*, the right-sided top surface area with reference to the cross section is formed to be larger so that the light detecting element 3 can be mounted, and the left-sided top surface area with reference to the cross section is formed to be smaller so as to reduce the unnecessary element mounting area. Thereby, the semiconductor laser device can be compact by miniaturizing it.

FIG. 1(*b*) shows a conventional example for comparison, in which the relationship of the curvature radiuses of the right-sided curved surface 1*a* and the left-sided curved surface 1*b* is set to be Ra=Rb. In this case, a larger element mounting area is formed on the left side with respect to Y–Y' cross section.

(Embodiment 2)

Figure 2:
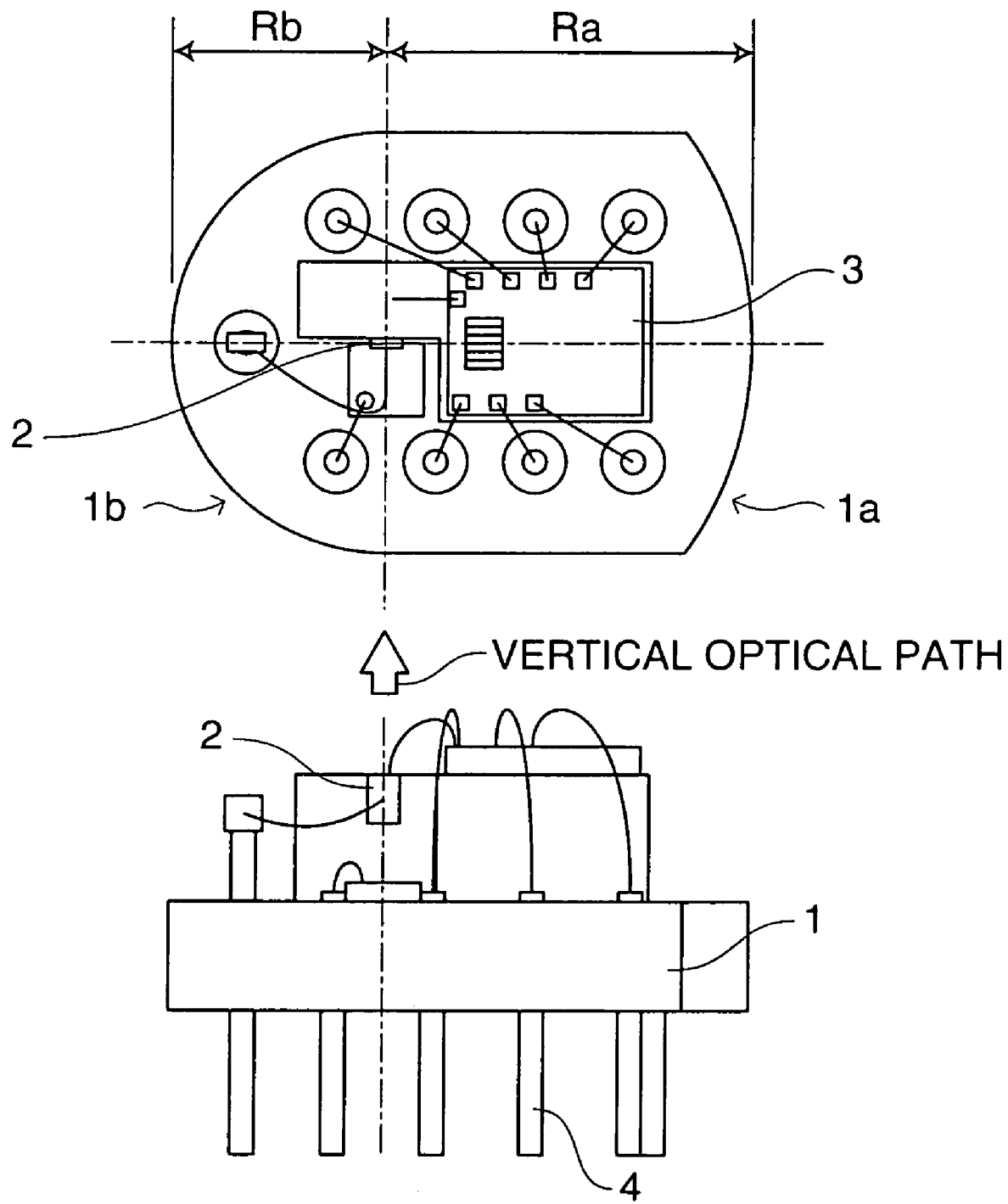
FIG. 2 shows the structure of a semiconductor laser device according to another embodiment of the present invention.

FIG. 2 shows the structure of a semiconductor laser device according to another embodiment of the present invention. FIG. 2 is a top view and a front view, in which the position of the vertical optical path is extremely biased to the left in order to make the device more compact, so that the relation of the curvature radiuses of the right-sided curved surface 1a and the left-sided curved surface 1b is set to be Ra>>Rb.

In this embodiment, much more leads 4 are positioned biased to the right with reference to the vertical optical path of the laser beam emitted from the semiconductor laser element 2, and the pitches between the leads 4 are narrowed, comparing to the embodiment 1. With this configuration, the element mounting area on the left is further reduced.

(Embodiment 3)

Figure 3:
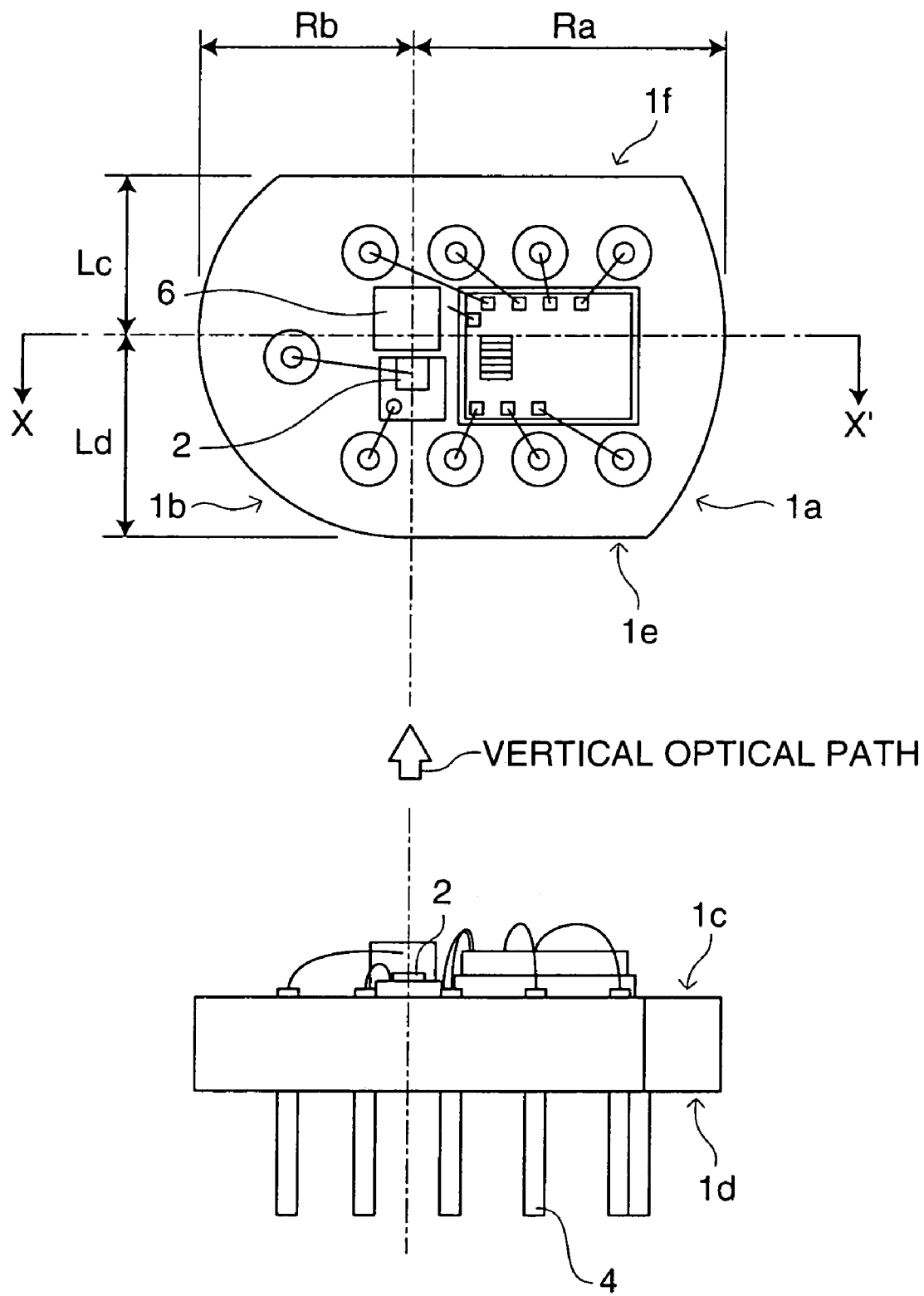
FIG. 3 shows the structure of a semiconductor laser device according to still another embodiment of the present invention.

FIG. 3 shows the structure of a semiconductor laser device according to still another embodiment of the present invention. In this embodiment, the semiconductor laser element 2 is so arranged that the laser beam is emitted in a direction horizontal to the top surface 1c. The laser beam is reflected upwards by the reflecting mirror 6 (reflector) arranged at an angle of 45° with reference to the top surface 1c, then is taken out vertically with reference to the top surface 1c. That is, the laser beam is to be the vertical optical path after reflected by the reflecting mirror 6.

As same as the case of the embodiment 2, the relationship between the curvature radiuses of the right-sided curved surface 1a and the left-sided curved surface 1b is set to be Ra>>Rb. Further, by setting the center at X–X' cross section, through the vertical optical path and parallel to the front surface 1e and the back surface 1f, the width of the front side (Ld) with reference to the X–X' cross section is formed to be larger so that the semiconductor laser element 2 is mounted to be biased to the front, and the width of the back side (Lc) with reference to the X–X' cross section is formed to be smaller so as to reduce the unnecessary element mounting area, to thereby establish the relationship of Lc<Ld. With this configuration, the unnecessary element mounting areas in both the right and left direction and the front and back direction can be further reduced, so that the semiconductor laser device can be more compact by further miniaturizing it.

(Embodiment 4)

Figure 5A:
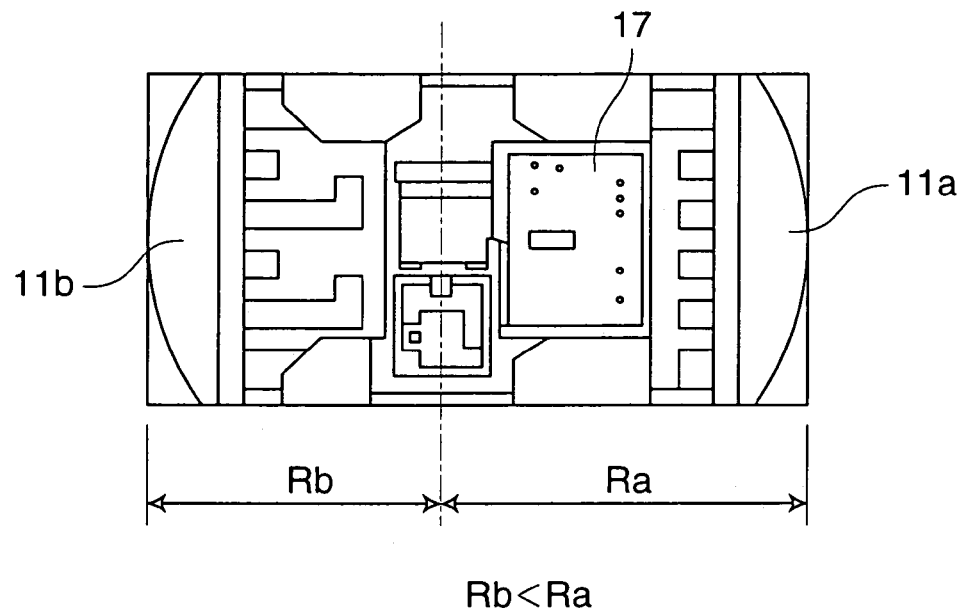
FIGS. 5(a) and FIG. 5(b) are diagrams for explaining the side relationship in the top view of the semiconductor laser device shown in FIGS. 4(a) to 4(c), and FIGS. 4(a') and 4(b').
Figure 5B:
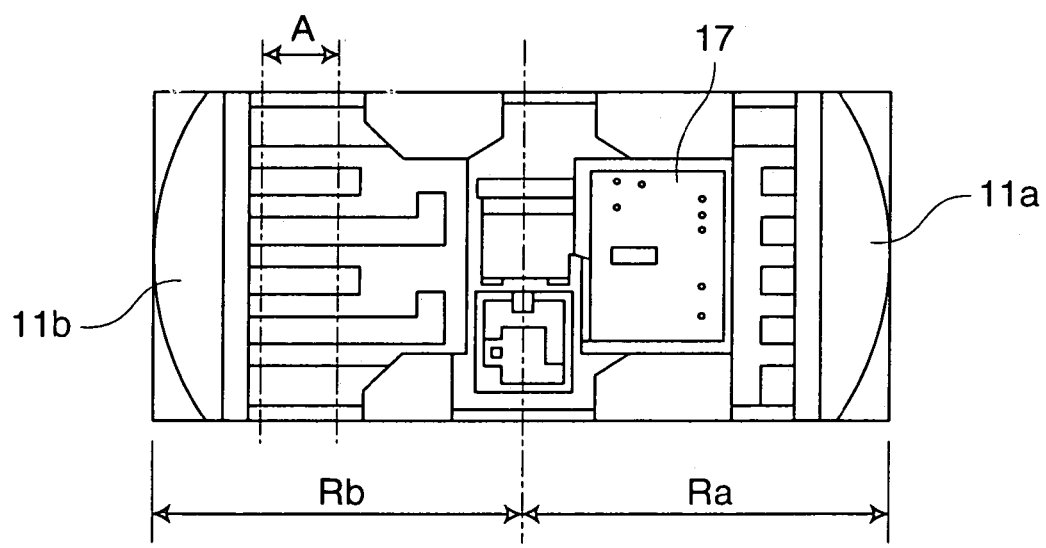

FIGS. 4(a) to 4(c), and FIGS. 5(a) to 5(b) are diagrams showing the structure of a semiconductor laser device of the lead frame type according to another embodiment of the present invention. FIG. 4(a) is a top view, FIG. 4(a') is another top view in which the hologram element is removed from the device shown in FIG. 4(a), FIG. 4(b) is a front view, FIG. 4(b') is a left side view, and FIG. 4(c) is a perspective view in which the hologram element is removed from the device shown in FIG. 4(a). FIG. 5(a) is a diagram for explaining the size relationship of the device shown in FIG. 4(a'). Note that FIG. 5(b) is a diagram for explaining a. conventional example for comparison.

In FIGS. 4(a) to 4(c), the reference numeral 11 indicates an electrically insulative casing which forms the body of a package (supporting member) having a plane are surrounded by a pair of right and left opposing ends and a pair of front and back opposing sides. Some parts of the insulative casing 11 are required high accuracy in size since optical components are mounted on it. Therefore, resin materials with high moldability are used. The insulative casing 11 are also required a high heat resistance since soldering is performed in the wiring step. Therefore, thermoplastic resins such as PPS and a liquid crystal polymar or thermosetting resins such as epoxy are preferably used as insulative materials.

The insulative casing 11 comprises: a rectangle base 22 having a plane area at the center, a pair of first protrusions 11a and 11b formed on the base 22 along the pair of right and left opposing ends so as to protrude upward, respectively, and a plurality of second protrusions 11c, 11d, 11e and 11f formed on the base 22 along the pair of front and back opposing sides so as to protrude upward, respectively.

On the both right and left ends of the plane area on the base 22 (that is a portion on which the first protrusions 11a and 11b are formed), areas into which a plurality of lead electrodes 12 are provided are formed, respectively. Further, an island plate 13 area, for mounting elements, are formed in between the areas on the both sides into which the lead electrodes 12 are provided.

On the island plate 13, a semiconductor laser element 15 is mounted via a submount 14. On the island plate 13, there is also mounted a reflector 16 (for example, one formed by coating a glass with multiple films so as to reflect a predetermined wavelength, or a mirror formed by coating a glass with aluminum) for turning the laser light emitted horizontally from the semiconductor laser element 90° so as to advance in a vertical upwards direction. Further, on the right side of the reflector 16, a light detecting element 17 (such as a divided photodiode, or OEIC in which an amplifier circuit is formed integral with the divided photodiode) for receiving a signal light from an optical disc is arranged adjacently.

With this arrangement of the elements, the light is emitted from the semiconductor laser element 15 in a horizontal direction along the plane of the base 22, and the optical axis of the light is turned 90° by the reflector 16, then emitted outside through the hologram element 19 shown in FIGS. 4(a), 4(b) and 4(b'). Here, an optical path advancing in a vertical upwards direction with reference to the top surface of the base 22 is the vertical optical path.

The leads (electrodes) 12 are mounted inside the insulative casing 11 and are connected by bonding through wires 18 to the semiconductor laser element 15 and the light detecting element 17 which needs to be electrically connected to the outside. Further, the leads (electrodes) 12 are drawn to the outside through the first protrusions 11a and 11b, or through a part under the first protrusions 11a and 11b and are bent downwardly with reference to the insulative casing 11.

The curved outer surfaces of the first protrusions 11a and 11b are formed of arcs having the optical axis (vertical optical path) as the central axes. On the other hand, in a pickup housing which acts as the housing of the optical pickup, there is provided a notch, for installing semiconductor laser device, having arcuate curved inner surfaces corresponding to respective first protrusions 11a and 11b. By fitting the semiconductor laser device into the pickup housing in such a manner that the notch and the first protrusions 11a and 11b coincide with, optical axis can be positioned easily when the semiconductor laser device is incorporated into the optical pickup.

Further, the second protrusions 11c, 11d, 11e, and 11f are configured to be arranged in point symmetry having the optical axis (vertical optical path) as the center one another along the pair of opposing sides arranged about the approximate center of the insulative casing 11, and the hologram element 19 is mounted on these protrusions.

In the semiconductor laser device according to this embodiment, the second protrusions 11c to 11f on which the hologram element 19 is mounted and the first protrusions 11a and 11b for positioning when the device is incorporated into the optical pickup are separated so as to be independent. Therefore, even if the first protrusions 11a and 11b are deformed by receiving the external force as a reaction when incorporated, there is no effect on the second protrusions 11c to 11f for mounting the hologram element. Accordingly, the hologram element 19 never moves, so that the electrical and optical characteristics are stable.

It should be noted that although the first protrusions 11a and 11b and the second protrusions 11c to 11f are formed with the same height, they do not necessarily have the same height since they are independent each other. For example, the device may be formed to have an optical system which is easy to incorporate and optimum in such a manner that the first protrusions 11a and 11b are formed to have a height with which they are easily incorporated into the optical pickup, and the second protrusions 11c to 11f are formed to have a height corresponding to the optical design of the hologram laser.

Further, by arranging the positions of the second protrusions 11c to 11f as close as possible one another, the hologram element 19 mounted on these protrusions can be miniaturized further. This enables to save the materials and also reduce the material costs of the hologram element 19.

Further, as shown in FIG. 4(b), the shape of the inner surfaces of the first protrusions 11a and 11b are not vertical but inclined with reference to the plane of the base 22 of the insulative casing 11. The reason for adopting this configuration is to avoid the capillary of the wire bonding device and the first protrusions 11a and 11b from interference each other when performing wire bonding to the lead electrodes 12 provided to the inner side of the insulative casing 11 positioned nearby the base ends of the first protrusions 11a and 11b. Therefore, the first protrusions 11a and 11b are tapered off in an upward direction corresponding to the tip of the capillary.

With this configuration, it is possible to perform wire bonding up to the position closely adjacent to the base ends of the first protrusions 11a and 11b. Therefore, the lengths of the lead electrodes 12 inside the insulative casing 11 can be shorten, so that the package (supporting member) itself can be miniaturized.

It should be noted that the first protrusions 11a and 11b have the wide base ends, though the tips are diminishing. Therefore, the characteristic of the device to catch the external force at the first protrusions 11a and 11b when incorporated into the optical pickup is not deteriorated.

Next, the curvature radiuses of the arcs forming the arcuate curved outer surfaces of the first protrusions 11a and 11b formed on the insulative casing 11 will be explained using FIGS. 5(a) and 5(b).

FIG. 5(a) is a diagram for explaining the size relationship in the top view of the semiconductor laser device shown in FIGS. 4(a) to 4(c). The curvature radiuses Ra and Rb of the arcs, respectively having the optical axis (vertical optical path) as the center in the two protrusions 11a and 11b formed on the right and left sides, are different in length, and the relationship is set to be Rb<Ra.

On the other hand, FIG. 5(b) is a top view of a semiconductor laser device as an example for comparison, in which the radiuses of the arcs in the first protrusions 11a and 11b of the arcs, respectively having the optical axis (vertical optical path) as the center in the first protrusions 11a and 11b, are equal in length so as to be Ra in both sides.

As shown in these figures, the semiconductor laser device of the present invention shown in FIG. 5(a) is miniaturized in the dimension of Ra−Rb in a right and left direction, comparing to the device shown in FIG. 5(b).

It should be noted that the side in which the curvature radius is shorten (Rb side) is configured so as to come to a side opposite to the side on which the signal light detecting element is mounted. The inside of the insulative casing of the Rd side is a wasting space only with the exposed leads shown as A in FIG. 5(b). Therefore, even though this space is reduced, there is no effect at all on mounting the elements and wiring.

(Embodiment 5)

Next, the housing structure of the optical pickup using a semiconductor laser device of the present invention will be briefly explained. FIG. 6(a) is a diagram for briefly explaining the optical pickup into which a semiconductor laser device is incorporated.

A semiconductor laser device 100 is provided in a pickup housing 50. A laser beam 110(vertical optical path) emitted from the semiconductor laser device 100 is collimated to be a horizontal beam by a collimator lens 101, the optical axis 120 of which is turned 90° by a reflecting mirror 102, then collected at an objective lens 103, so that a spot falls on an optical disc 104.

The state in which the semiconductor laser device 100 is incorporated into the pickup housing 50 will be explained referring to FIGS. 6(b), 6(c) and 6(d).

Figure 6C:
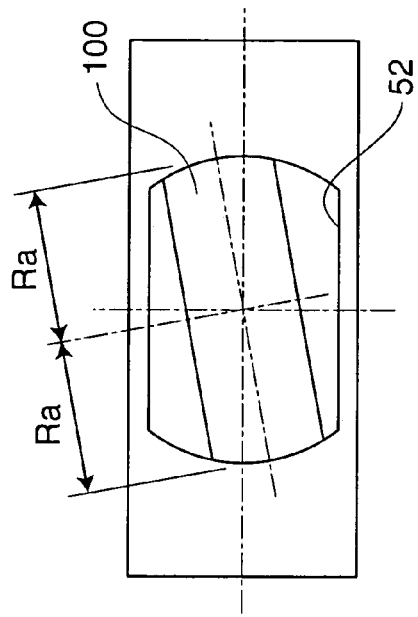
FIGS. 6(a) to 6(d) are diagrams showing the structure of an optical pickup into which a semiconductor laser devise is incorporated.
Figure 6D:
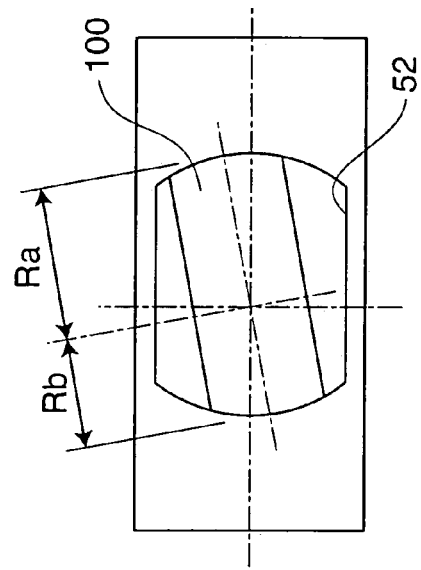
Figure 6A:
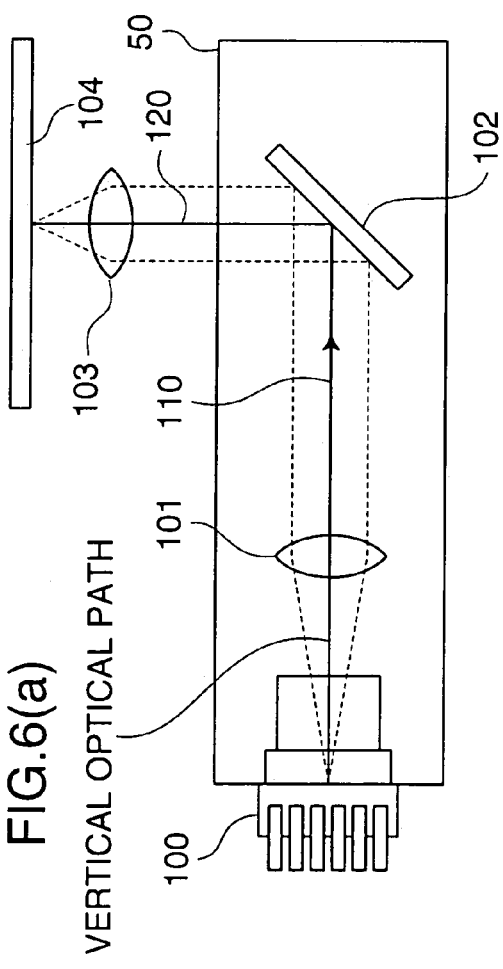
Figure 6B:
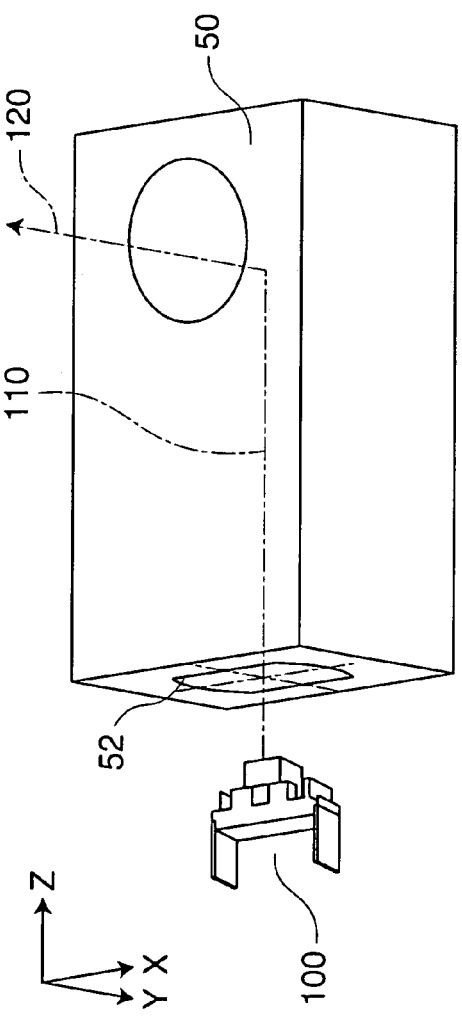

FIG. 6(b) is a perspective view showing the pickup housing 50 before the semiconductor laser device 100 is incorporated into it. In the pickup housing 50, a installation hole 52 for installing the semiconductor laser device 100 is provided. The installation hole 52 has arcuate curved inner surfaces. FIGS. 6(C) and 6(d) are perspective views showing the relationship between the installation hole 52 and the semiconductor laser apparatus 100, in which the installation hole 52 and the semiconductor laser device are shown as shapes formed of two arcs and two lines respectively.

FIG. 6(c) shows a conventional state of incorporating the semiconductor laser device, in which the right and left arcs of both the semiconductor laser device 100 and the installation hole 52 have the same curvature radius Ra. On the other hand, FIG. 6(d) shows a state of incorporating the semiconductor laser device of the present invention, in which the right and left arcs of the semiconductor laser device 100 have different curvature radiuses, so that a pair of arcs of the curved inner surface of the installation hole 52 also have different curvature radiuses corresponding to the semiconductor laser device 100. With this configuration, the width of the pickup housing 50 is also miniaturized corresponding to the shortened curvature radius of the arc.

Further, since the curvature radiuses of the arcs of the installation hole 52 and the corresponding curvature radiuses of the arcs of the protrusions 11a and 11b provided on the semiconductor laser device 100 are the same, the semiconductor laser device 100 can be turned smoothly around the optical axis (vertical optical path) as the center when incorporated in to the optical pickup. Therefore, a turning adjustment of the three beams can be performed easily as same as conventional devices.

What is claimed is:

1. A semiconductor laser device including an element mounting area, which is formed on a top surface of a supporting member having a plane area surrounded by a pair of right and left opposing ends and a pair of front and back opposing sides, for mounting a series of elements including: a semiconductor laser element, and a light detecting element which detects a laser beam emitted from the semiconductor laser element and reflected at an outside optical disc surface so as to be re-entered, wherein an optical path of the laser beam from the semiconductor laser element to the optical disc surface includes a vertical optical path advancing from the element mounting area of the supporting member in an approximately vertical upwards direction, arcuate curved outer surfaces are formed on the pair of right and left opposing ends of the supporting member, respectively, or on a pair of right and left protrusions formed on the supporting member, respectively, by which the supporting member is fitted into an installation hole, for a semiconductor laser device, having arcuate curved inner surfaces, and the arcuate curved outer surfaces are formed of arcs having the vertical optical path as central axes, and are so formed that lengths of curvature radiuses of right and left sides are different.

2. The semiconductor laser device as claimed in claim 1, wherein the supporting member is an electrically insulative casing which comprises: a base having the plane area surrounded by the opposing ends and the opposing sides, a pair of first protrusions formed on the base along the pair of right and left opposing ends so as to put the plane area in between them, and a plurality of second protrusions formed on the base along the pair of front and back opposing sides so as to put the plane area in between them.

3. The semiconductor device as claimed in claim 1, wherein the light detecting element is mounted to be biased to either right or left side of the curved outer surfaces, and a curvature radius of an arc, corresponding to the side of the curved outer surface to which the light detecting element is mounted to be biased, is longer than a curvature radius of an arc corresponding to an opposing curved outer surface.

4. The semiconductor laser device as claimed in claim 1, wherein the supporting member has the vertical optical path on a position which is biased to either front or back side of the opposing sides.

5. The semiconductor laser device as claimed in claim 1, wherein the element mounting area further mounts a reflector, and a laser beam is emitted from the semiconductor laser element in parallel to the top surface of the supporting member and reflected at the reflector so as to form the vertical optical path.

6. An optical pickup comprising:

a semiconductor laser device including an element mounting area, which is formed on a top surface of a supporting member having a plane area surrounded by a pair of right and left opposing ends and a pair of front and back opposing sides, for mounting a series of elements including: a semiconductor laser element, and a light detecting element which detects a laser beam emitted from the semiconductor laser element and reflected by an outside optical disc surface so as to be reentered, wherein an optical path of the laser beam from the semiconductor laser element to the optical disc surface includes a vertical optical path advancing from the element mounting area of the supporting member in an approximately vertical upwards direction with reference to the element mounting area, arcuate curved outer surfaces are formed on the pair of right and left opposing ends of the supporting member, respectively, or on a pair of right and left protrusions formed on the supporting member, respectively, by which the supporting member is fitted into an installation hole, for a semiconductor laser device, having arcuate curved inner surfaces, and the arcuate curved outer surfaces are formed of arcs having the vertical optical path as central axes, and are so formed that lengths of curvature radiuses of right and left sides are different; and a pickup housing for incorporating the semiconductor laser device; wherein an installation hole having arcuate curved inner surfaces is formed in the pickup housing, to which hole the supporting member is fitted into in such a manner that the arcuate curved outer surfaces of the semiconductor laser device coincide with the installation hole.

7. The optical pickup as claimed in claim 6, wherein the supporting member is an electrically insulative casing which comprises: a base having the plane area surrounded by the opposing ends and the opposing sides, a pair of first protrusions formed on the base along the pair of right and left opposing ends so as to put the plane area in between them, and a plurality of second protrusions formed on the base along the pair of front and back opposing sides so as to put the plane area in between them.

8. The optical pickup as claimed in claim 6, wherein the light detecting element is mounted to be biased to either right or left side of the curved outer surfaces, and a curvature radius of an arc, corresponding to the side of the curved outer surface to which the light detecting element is mounted to be biased, is longer than a curvature radius of an arc corresponding to an opposing curved outer surface.

9. The optical pickup as claimed in claim 6, wherein the supporting member has the vertical optical path on a position which is biased to either front or back side of the opposing sides.

10. The optical pickup as claimed in claim 6, wherein the element mounting area further mounts a reflector, and a laser beam is emitted from the semiconductor laser element in parallel to the top surface of the supporting member and reflected at the reflector so as to form the vertical optical path.

* * * * *